(12) United States Patent
Osada et al.

(10) Patent No.: US 11,804,414 B2
(45) Date of Patent: Oct. 31, 2023

(54) SEMICONDUCTOR DEVICE COMPRISING A LEAD ELECTRODE INCLUDING A THROUGH HOLE

(71) Applicant: Mitsubishi Electric Corporation, Tokyo (JP)

(72) Inventors: Kazuhisa Osada, Tokyo (JP); Yuki Yano, Tokyo (JP); Satoru Ishikawa, Tokyo (JP); Shohei Ogawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 129 days.

(21) Appl. No.: 17/568,626

(22) Filed: Jan. 4, 2022

(65) Prior Publication Data
US 2022/0310463 A1    Sep. 29, 2022

(30) Foreign Application Priority Data
Mar. 29, 2021   (JP) .................. 2021-055030

(51) Int. Cl.
*H01L 23/047*     (2006.01)
(52) U.S. Cl.
CPC ................. *H01L 23/047* (2013.01)
(58) Field of Classification Search
CPC .................................................. H01L 23/047
USPC ....................................................... 257/666
See application file for complete search history.

(56) References Cited

U.S. PATENT DOCUMENTS

| 2003/0183841 | A1* | 10/2003 | Taguchi | H01L 23/10 257/E23.185 |
| 2014/0167237 | A1* | 6/2014 | Yoo | H01L 24/73 257/676 |
| 2021/0398880 | A1* | 12/2021 | Kanai | H01L 21/565 |

FOREIGN PATENT DOCUMENTS

| JP | 2007-287833 A | 11/2007 |
| JP | 2008-210825 A | 9/2008 |
| JP | 2018-067588 A | 4/2018 |

\* cited by examiner

*Primary Examiner* — Ajay Arora
(74) *Attorney, Agent, or Firm* — Studebaker & Brackett PC

(57) ABSTRACT

An object is to provide a semiconductor device in which heat generated in a lead electrode when conducting a large current can be reduced and the bonding quality between the lead electrode and a semiconductor element can be inspected easily. A semiconductor device includes: a base portion; a semiconductor element mounted on the base portion; a metal part erect with respect to the semiconductor element and having one end bonded, with a bonding material, to a principal surface of the semiconductor element opposite to another principal surface of the semiconductor element mounted on the base portion; and a lead electrode connected to the semiconductor element through the metal part. The lead electrode includes a through hole extending in a thickness direction. The metal part connects the semiconductor element to the lead electrode, while inserted into the through hole of the lead electrode together with a part of the bonding material.

6 Claims, 18 Drawing Sheets

F I G. 8
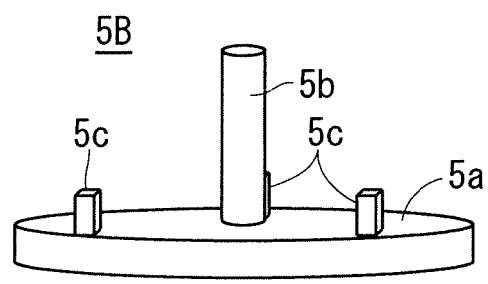

F I G. 9
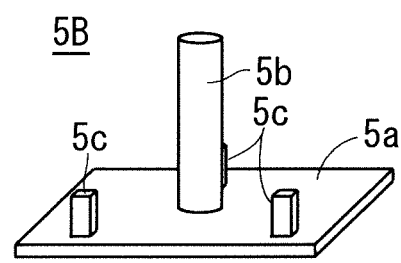

SEMICONDUCTOR DEVICE COMPRISING A LEAD ELECTRODE INCLUDING A THROUGH HOLE

BACKGROUND OF THE INVENTION

Field of the Invention

The present disclosure relates to a semiconductor device.

Description of the Background Art

For pursuing a larger current, longer life, and higher reliability in power semiconductor devices, methods for directly bonding a lead electrode to a semiconductor element for establishing a circuit connection with an external electrode are used, without using wire bonding in a main current path.

When a lead electrode is bonded to a semiconductor element in a conventional semiconductor device, a distance between the lead electrode and the semiconductor element is unstable because the shape of the lead electrode varies or the lead electrode is warped or deformed while being heated. Thus, a bonding area between the lead electrode and the semiconductor element is sometimes reduced. This consequently increases the current density of the lead electrode. The heat locally generated in the lead electrode when conducting a large current causes a problem of shortening the life of the semiconductor device.

For example, Japanese Patent Application Laid-Open No. 2007-287833 discloses that a cylindrical energized block is fixed to a predetermined position of a surface electrode in a lateral direction by soldering, and a second connection circuit is connected to the surface electrode through the energized block fixed in the lateral direction. This increases a bonding area between the second connection circuit and the surface electrode. Here, the lateral direction indicates an axial direction of the cylindrical energized block which is parallel to the bonding surface.

Since the energized block is disposed in the lateral direction under the technology of Japanese Patent Application Laid-Open No. 2007-287833, a bonding surface between the second connection circuit and the energized block and a bonding surface between the energized block and the surface electrode are curved surfaces. Thus, the bonding surface between the second connection circuit and the surface electrode is also a curved surface.

One of the methods for inspecting the bonding quality of the second connection circuit and the surface electrode is ultrasonic flaw detection. However, there has been a problem of difficulty in inspecting a curved bonding surface by the ultrasonic flaw detection.

SUMMARY

An object of the present disclosure is to provide a semiconductor device in which heat generated in a lead electrode when conducting a large current can be reduced and the bonding quality between the lead electrode and a semiconductor element can be inspected easily.

A semiconductor device according to the present disclosure includes a base portion, a semiconductor element, a metal part, and a lead electrode. The semiconductor element is mounted on the base portion. The metal part has one end bonded, with a bonding material, to a principal surface of the semiconductor element which is opposite to another principal surface of the semiconductor element mounted on the base portion, the metal part being erect with respect to the semiconductor element. The lead electrode is connected to the semiconductor element through the metal part. The lead electrode includes a through hole extending in a thickness direction. The metal part connects the semiconductor element to the lead electrode, with the metal part being inserted into the through hole of the lead electrode together with a part of the bonding material.

Since the metal part connects the semiconductor element to the lead electrode with the metal part being inserted into the through hole of the lead electrode together with the bonding material, a bonding area between the semiconductor element and the lead electrode can be increased. This reduces the current density between the lead electrode and the semiconductor elements. Thus, the heat generated in the lead electrode when conducting a large current can be reduced.

Since the bonding surface between the semiconductor elements and the lead electrode through the metal parts is a plane, the bonding quality between the semiconductor elements and the lead electrode can be inspected easily.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a perspective view of an example metal part included in the semiconductor device according to Embodiment 3;

FIG. 9 is a perspective view of another example metal part included in the semiconductor device according to Embodiment 3;

DESCRIPTION OF THE PREFERRED EMBODIMENTS

Embodiment 1

[Structure of Semiconductor Device]

Figure 1:
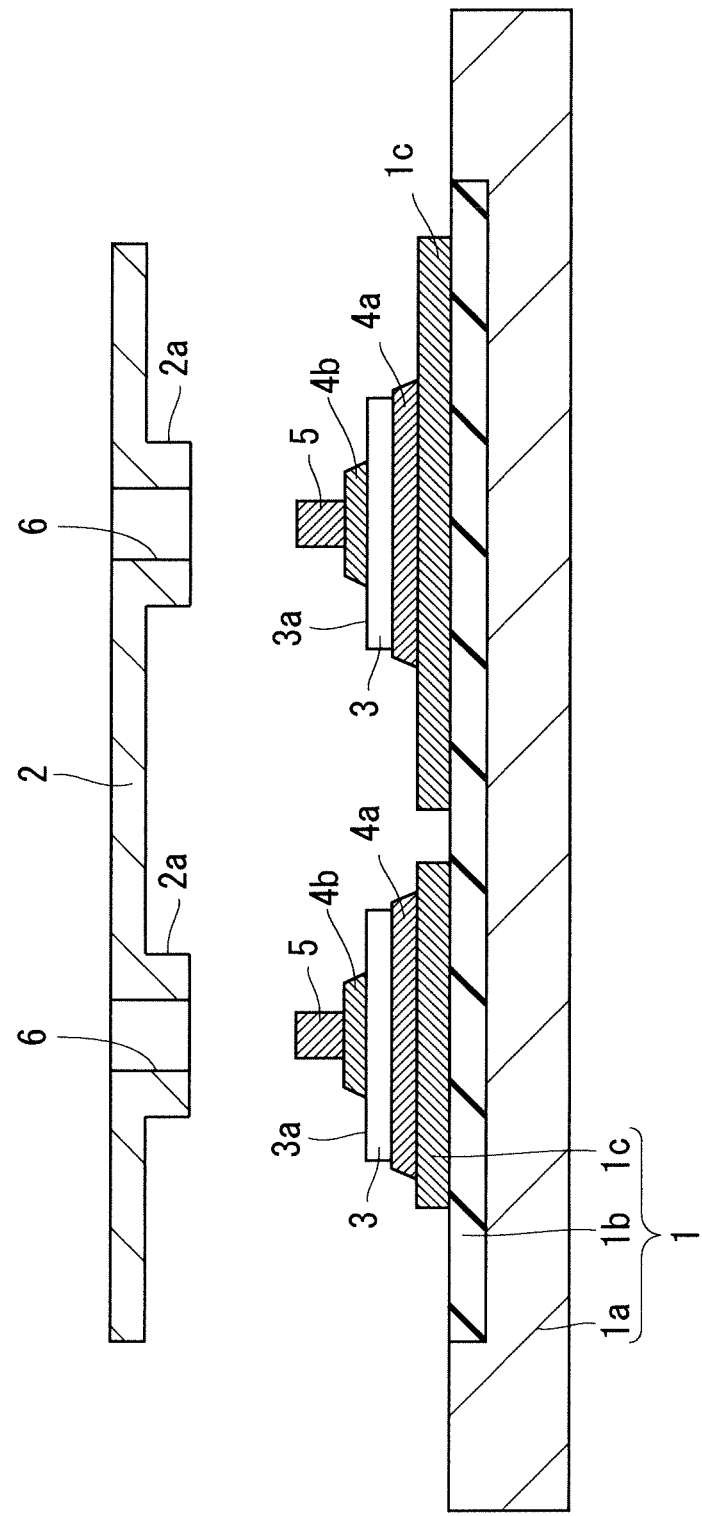
FIG. 1 is a cross-sectional view of a semiconductor device being assembled according to Embodiment 1.
Figure 2:
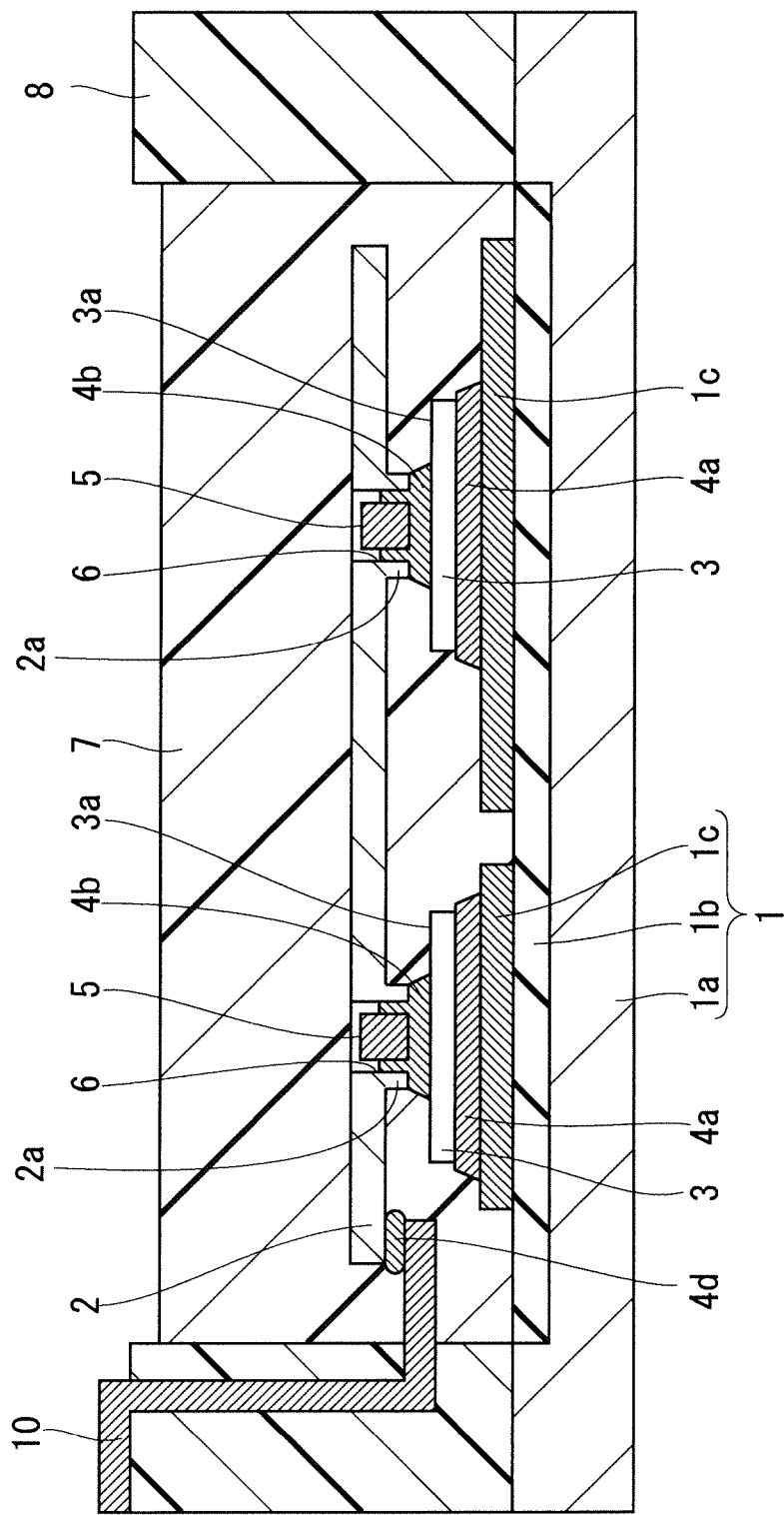
FIG. 2 is a cross-sectional view of the semiconductor device according to Embodiment 1.

Embodiment 1 will be described with reference to the drawings. FIG. 1 is a cross-sectional view of a semiconductor device being assembled according to Embodiment 1. FIG. 2 is a cross-sectional view of the semiconductor device according to Embodiment 1.

As illustrated in FIGS. 1 and 2, the semiconductor device includes a base portion 1, semiconductor elements 3, metal parts 5, a lead electrode 2, a sealing resin 7, a casing 8, and an external electrode terminal 10.

The base portion 1 includes a heat sink 1a, an insulating substrate 1b, and a metal pattern 1c. The heat sink 1a is made of a metal with superior thermal conductivity, such as an aluminum alloy or copper.

The insulating substrate 1b is disposed in a region of the upper surface of the heat sink 1a except its outer edge. Furthermore, the insulating substrate 1b is made of a ceramic with superior thermal conductivity such as aluminum nitride or silicon nitride, or is made of a resin with superior thermal conductivity.

The metal pattern 1c is formed on the upper surface of the insulating substrate 1b. Furthermore, the metal pattern 1c is made of, for example, copper or an aluminum alloy.

The semiconductor elements 3 are mounted on the base portion 1. Specifically, the semiconductor elements 3 are bonded to the upper surface of the metal pattern 1c with a bonding material 4a such as solder.

IGBTs, diodes, and reverse conducting IGBTs that are made of silicon (Si) are often used as the semiconductor elements 3. Besides, MOSFETs and Schottky diodes that are made of a material with a band gap larger than that of Si, such as silicon carbide (SiC) or gallium nitride (GaN) may be used as the semiconductor elements 3.

Although the two semiconductor elements 3 are mounted on the base portion 1, the number of the semiconductor elements 3 to be mounted on the base portion 1 is not limited to this, but may be changed if needed for particular applications.

As illustrated in FIGS. 1 and 2, the metal parts 5 are molded into cylinders using copper or a copper alloy, and connect the semiconductor elements 3 to the lead electrode 2. Furthermore, the metal parts 5 may be made of, for example, molybdenum or tungsten with a thermal expansion coefficient closer to that of the semiconductor elements 3.

The metal part 5 has one end bonded, with a bonding material 4b such as solder, to a principal surface 3a of the semiconductor element 3 which is opposite to another principal surface of the semiconductor element 3 mounted on the base portion 1.

The metal parts 5 are preferably dimensionally stable and self-sustaining on the principal surfaces 3a of the semiconductor elements 3. For example, the semiconductor elements 3 are normally rectangular in a top view. When an electrode (not illustrated) formed on the semiconductor element 3 is a cube of 5 mm, a diameter of the metal part 5 is preferably less than 5 mm in consideration of a solder-wetting area of the bonding material 4b. However, the diameter of the metal part 5 may be changed so that the current capacity of the metal part 5 is measured as an appropriate value.

The lead electrode 2 is made of copper or a copper alloy, and is connected to the semiconductor elements 3 through the metal parts 5. The lead electrode 2 has thick portions 2a which are thicker and extend downward more than the other portions, are located around the metal parts 5, and face the bonding material 4b. Each of the thick portions 2a has a through hole 6 extending in a thickness direction. The through hole 6 is larger in diameter than the metal part 5 so that the metal part 5 can be inserted into the through hole 6 and a part of the bonding material 4b can infiltrate the through hole 6.

The lead electrode 2 is connected to the semiconductor elements 3, with the metal parts 5 being inserted into the through holes 6 of the lead electrode 2 together with a part of the bonding material 4b. When the thickness of the thick portions 2a in the lead electrode 2 is greater than the height of the metal parts 5, the upper surface of the metal parts 5 may be covered with the bonding material 4b, or exposed without being covered with the bonding material 4b.

The casing 8 is formed into a rectangular frame in a top view, and is bonded to the upper surface of the base portion 1 with an adhesive (not illustrated) to surround the semiconductor elements 3, the metal parts 5, and the side surface of the lead electrode 2.

The external electrode terminal 10 is made of copper or a copper alloy and is, for example, insert-molded into the casing 8. One terminal portion of the external electrode terminal 10 is fixed to the upper end of the casing 8, and the other terminal portion is connected to one terminal portion of the lead electrode 2 with a bonding material 4d such as solder.

The sealing resin 7 is filled into the casing 8 to seal the semiconductor elements 3, the metal parts 5, and the lead electrode 2. The sealing resin 7 is silicone gel or an epoxy resin. The sealing resin 7 is not limited to this, but may be any resin having predetermined properties including a modulus of elasticity, heat resistance, adhesiveness, and a thermal expansion coefficient.

Next, a method for assembling the semiconductor device will be described with reference to FIGS. 1 and 2. First, the base portion 1 is bonded to the semiconductor elements 3 with the bonding material 4a. Then, the semiconductor elements 3 are bonded to the metal parts 5 with the bonding material 4b. Solder is typically often used as the bonding materials 4a and 4b. In the bonding processes, the components are bonded together by heating the bonding materials 4a and 4b to a temperature exceeding the melting point thereof.

The bonding materials 4a and 4b may be molded bonding materials such as plate solder, or soldering paste to be applied using, for example, screen printing, a dispenser, or a 3D printer. The bonding materials 4a and 4b are applied to the metal pattern 1c and the principal surfaces 3a of the semiconductor elements 3.

When the metal parts 5 are disposed on the bonding material 4b, the positions can be determined using a positioning fixture for mounting the semiconductor elements 3. However, the positions of the metal parts 5 may be determined using a self-aligning action (a self-aligning effect) of a surface tension when the bonding material 4b melts.

Next, the casing 8 is bonded to the base portion 1. A silicone-based or epoxy-based adhesive (not illustrated) is applied to a bonding surface between the lower end of the casing 8 and the outer edge of the upper surface of the heat sink 1a of the base portion 1. Then, a load is applied to the bonding surface to which the adhesive is applied, so that the adhesive comes in tight contact with the bonding surface. Next, the casing 8 is secured to the heat sink 1a through, for example, self-tapping screws (not illustrated). Alternatively, the adhesive may be heated to be solidified with the casing 8 being fixed to the heat sink 1a by, for example, a clamp fixture, instead of securing the casing 8 to the heat sink 1a through the self-tapping screws.

Next, the lead electrode 2 is disposed so that the metal parts 5 disposed on the principal surfaces 3a of the semiconductor elements 3 are inserted into the through holes 6 in the lead electrode 2. Then, the assembly is heated at the temperature exceeding the melting point of the bonding material 4b, so that the semiconductor elements 3, the lead electrode 2, and the metal parts 5 are bonded together with the bonding material 4b. Here, the melted bonding material 4b infiltrates between the through holes 6 and the metal parts 5 and wicks up the side surfaces of the metal parts 5. This increases the bonding area between the semiconductor elements 3 and the lead electrode 2. The side surfaces of the metal parts 5 may be soldered in advance before the heating.

At the same time, the lead electrode 2 is bonded to the external electrode terminal 10 molded into the casing 8 with the bonding material 4d.

The external electrode terminal 10 to be connected to an external device is connected to the principal surfaces 3a of the semiconductor elements 3 through wires by ultrasonic bonding so that the external device controls the semiconductor elements 3, which is not illustrated. Wires made of, for example, aluminum higher in thermal conductivity and electric conductivity are typically often used as the wires that connect the external electrode terminal 10 to the principal surfaces 3a of the semiconductor elements 3.

Next, the sealing resin 7 is filled into the casing 8 to seal the semiconductor elements 3, the metal parts 5, and the lead electrode 2. The assembly is put into, for example, a curing furnace so that the sealing resin 7 is hardened. Consequently, assembling the semiconductor device is completed. After the electrical characteristics necessary for the semiconductor device are inspected, the semiconductor device is completed.

[Advantages]

The semiconductor device according to Embodiment 1 includes: the base portion 1; the semiconductor element 3 mounted on the base portion 1; the metal part 5 having one end bonded, with the bonding material 4b, to the principal surface 3a of the semiconductor element 3 which is opposite to another principal surface of the semiconductor element 3 mounted on the base portion 1, the metal part 5 being erect with respect to the semiconductor element 3; and the lead electrode 2 connected to the semiconductor element 3 through the metal part 5, wherein the lead electrode 2 includes the through hole 6 extending in a thickness direction, and the metal part 5 connects the semiconductor element 3 to the lead electrode 2, with the metal part 5 being inserted into the through hole 6 of the lead electrode 2 together with a part of the bonding material 4b.

The metal parts 5 connect the semiconductor elements 3 to the lead electrode 2, with the metal parts 5 being inserted into the through holes 6 of the lead electrode 2 together with a part of the bonding material 4b. In addition to the bonding surface between the bottom surface of the lead electrode 2 and the principal surfaces 3a of the semiconductor elements 3, the inner surfaces of the through holes 6 of the lead electrode 2 are bonded to the side surfaces of the metal parts 5. This can increase the bonding area between the semiconductor elements 3 and the lead electrode 2. Since this reduces the current density between the lead electrode 2 and the semiconductor elements 3, the heat generated in the lead electrode 2 when conducting a large current can be reduced. Thus, this can suppress a decrease in the life of the semiconductor device. Consequently, the semiconductor device is available for a long time.

Conventionally, there has been a problem of difficulty in inspecting the bonding quality of a curved bonding surface between a semiconductor element and a lead electrode by the ultrasonic flaw detection. However, since the bonding surface between the semiconductor elements 3 and the lead electrode 2 through the metal parts 5 is a plane according to Embodiment 1, the bonding quality between the semiconductor elements 3 and the lead electrode 2 can be inspected by the ultrasonic flaw detection more easily than that when the bonding surface is a curved surface.

Furthermore, the use of a structure in which the metal parts 5 each disposed on the principal surface 3a of the semiconductor element 3 are inserted into the through holes 6 in the lead electrode 2 can prevent the lead electrode 2 from floating with respect to the principal surfaces 3a of the semiconductor elements 3 when the lead electrode 2 is positioned on the principal surfaces 3a of the semiconductor elements 3. Thus, the bondability between the semiconductor elements 3 and the lead electrode 2 can be improved.

Furthermore, the metal parts 5 can position the lead electrode 2 in a horizontal direction without using a positioning fixture. Thus, the manufacturing cost of the semiconductor device can be reduced, and the semiconductor device can be provided at low cost.

The semiconductor device may have a structure in which the one lead electrode 2 is connected in parallel with at least three of the semiconductor elements 3. When the semiconductor elements 3 whose outside dimensions are less are used, the bonding area between the semiconductor elements 3 and the lead electrode 2 is reduced, and the number of bonding portions increases. This reduces the positioning accuracy of the lead electrode 2 to the semiconductor elements 3, and reduces the bondability between the semiconductor elements 3 and the lead electrode 2 in a conventional structure.

However, increasing the number of the metal parts 5 and the through holes 6 of the lead electrode 2 depending on the number of the semiconductor elements 3 in the structure according to Embodiment 1 can suppress a decrease in the positioning accuracy of the lead electrode 2 to the semiconductor elements 3, and a decrease in the bonding area between the semiconductor elements 3 and the lead electrode 2. This enables the application of the semiconductor elements 3 whose outside dimensions are less to a semiconductor device with a high current capacity. Thus, the semiconductor device can be provided at lower cost.

Embodiment 2

[Structure of Semiconductor Device]

Figure 3:
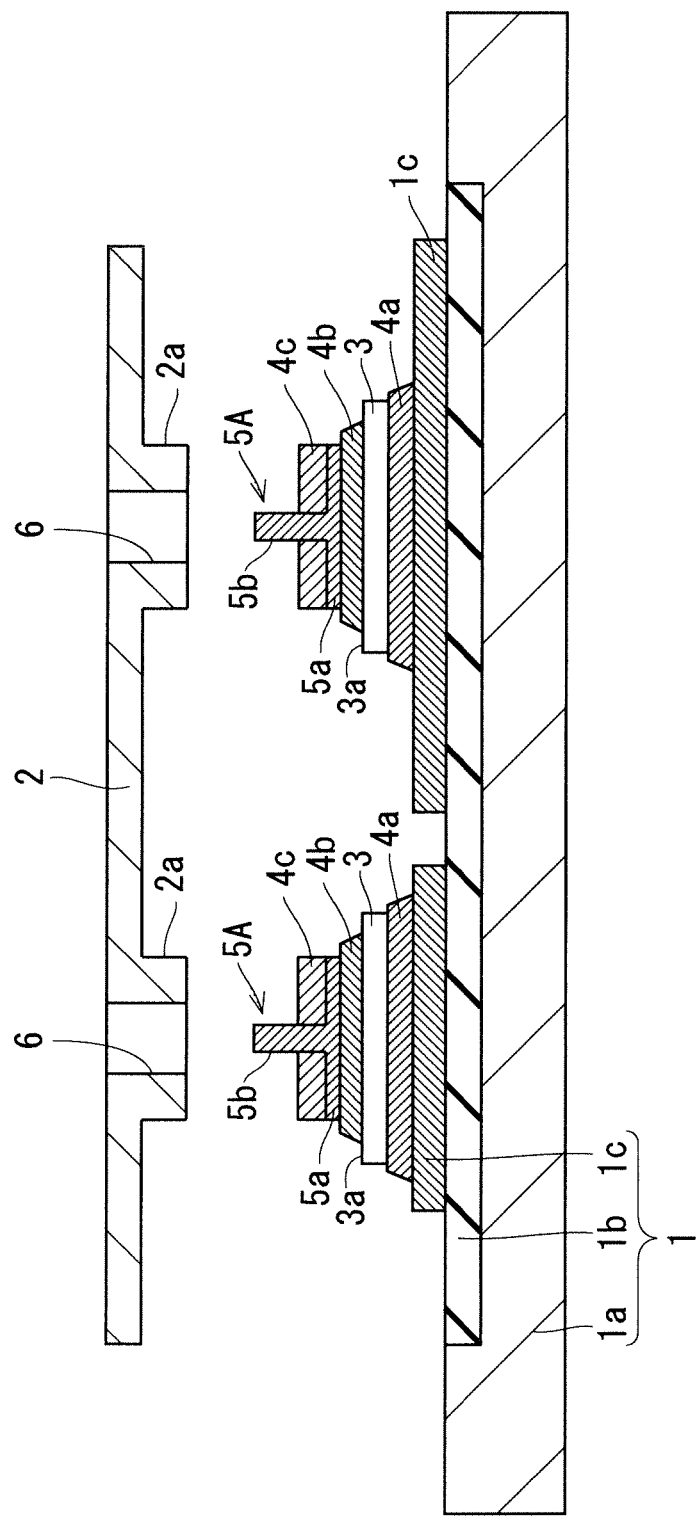
FIG. 3 is a cross-sectional view of a semiconductor device being assembled according to Embodiment 2.
Figure 4:
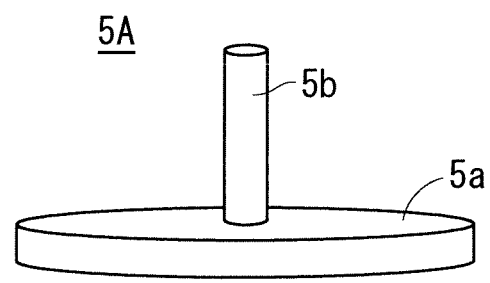
FIG. 4 is a perspective view of an example metal part included in the semiconductor device according to Embodiment 2.
Figure 5:
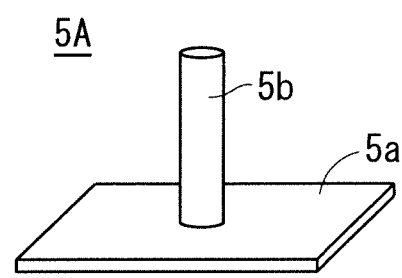
FIG. 5 is a perspective view of another example metal part included in the semiconductor device according to Embodiment 2.
Figure 6:
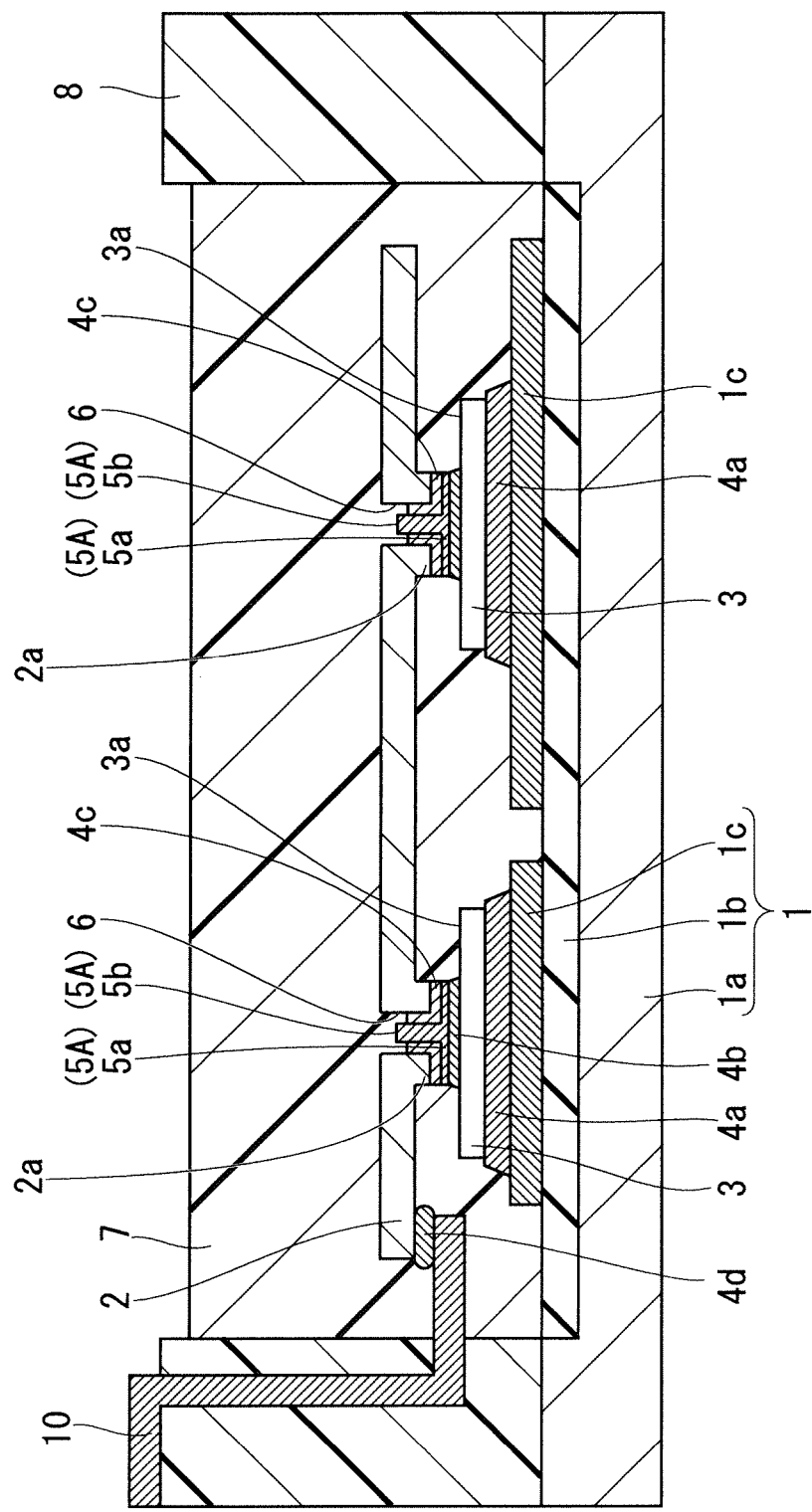
FIG. 6 is a cross-sectional view of the semiconductor device according to Embodiment 2.

Next, a semiconductor device according to Embodiment 2 will be described. FIG. 3 is a cross-sectional view of the semiconductor device being assembled according to Embodiment 2. FIG. 4 is a perspective view of an example metal part 5A included in the semiconductor device according to Embodiment 2. FIG. 5 is a perspective view of another example metal part 5A. FIG. 6 is a cross-sectional view of the semiconductor device according to Embodiment 2. In Embodiment 2, the same reference numerals are assigned to the same constituent elements described in Embodiment 1, and the description thereof will be omitted.

As illustrated in FIGS. 3, 4, and 6, the semiconductor device according to Embodiment 2 includes the metal parts 5A instead of the metal parts 5 according to Embodiment 1. The metal part 5A includes a plate portion 5a and a column portion 5b. The plate portion 5a is a circular plate, and has a lower surface that is one principal surface and is bonded to the principal surface 3a of the semiconductor element 3 with the bonding material 4b, and an upper surface that is the other principal surface and is bonded, with a bonding material 4c, to the thick portion 2a that is a surrounding area of the through hole 6 in the lead electrode 2. Here, the plate portion 5a is not limited to a circular plate, but may be a rectangular plate as illustrated in FIG. 5.

As illustrated in FIGS. 3, 4, and 6, the column portion 5b is a cylinder, and has one end connected to the upper surface of the plate portion 5a, and is erect with respect to the plate portion 5a.

Since the principal surface of the plate portion 5a bonded to the semiconductor element 3 has an area larger than that of a surface of an end of the column portion 5b to be inserted into the through hole 6, the metal parts 5A can support the lead electrode 2 in a stable state.

When the semiconductor device is assembled, the bonding material 4c is applied to the plate portions 5a so that the lead electrode 2 is bonded to the metal parts 5A with the bonding material 4c. When the assembly is heated at the temperature exceeding the melting point of the bonding material 4c, the melted bonding material 4c infiltrates between the through holes 6 and the column portions 5b and wicks up the column portions 5b. This increases the bonding area between the semiconductor elements 3 and the lead electrode 2. Soldering paste may be applied to the column portions 5b as the bonding material 4c, or plate solder molded to fit the column portions 5b may be disposed around the column portions 5b. Alternatively, the metal parts 5A each with the column portion 5b to which the bonding material 4c is applied in advance may be disposed on the principal surfaces 3a of the semiconductor elements 3. The other basic structures of the semiconductor device are identical to those according to Embodiment 1.

[Advantages]

Similarly to Embodiment 1, the heat generated in the lead electrode 2 when conducting a large current can be reduced, and the bonding quality between the lead electrode 2 and the semiconductor elements 3 can be inspected easily in the semiconductor device according to Embodiment 2.

Furthermore, the metal part 5A includes: the plate portion 5a having the lower surface bonded to the principal surface 3a of the semiconductor element 3 and the upper surface bonded to the surrounding area of the through hole 6 in the lead electrode 2; and the column portion 5b that is erect with respect to the plate portion 5a and inserted into the through hole 6, and the principal surface of the plate portion 5a bonded to the semiconductor element 3 has an area larger than that of a surface of an end of the column portion 5b to be inserted into the through hole 6.

Thus, the metal parts 5A can be self-sustaining on the principal surfaces 3a of the semiconductor elements 3 in a stable state, and support the lead electrode 2 in the stable state. This enables the positioning of the lead electrode 2 in a horizontal direction more easily than that according to Embodiment 1. Thus, the semiconductor elements 3 and the lead electrode 2 can be bonded together in a stable state.

Embodiment 3

[Structure of Semiconductor Device]

Figure 7:
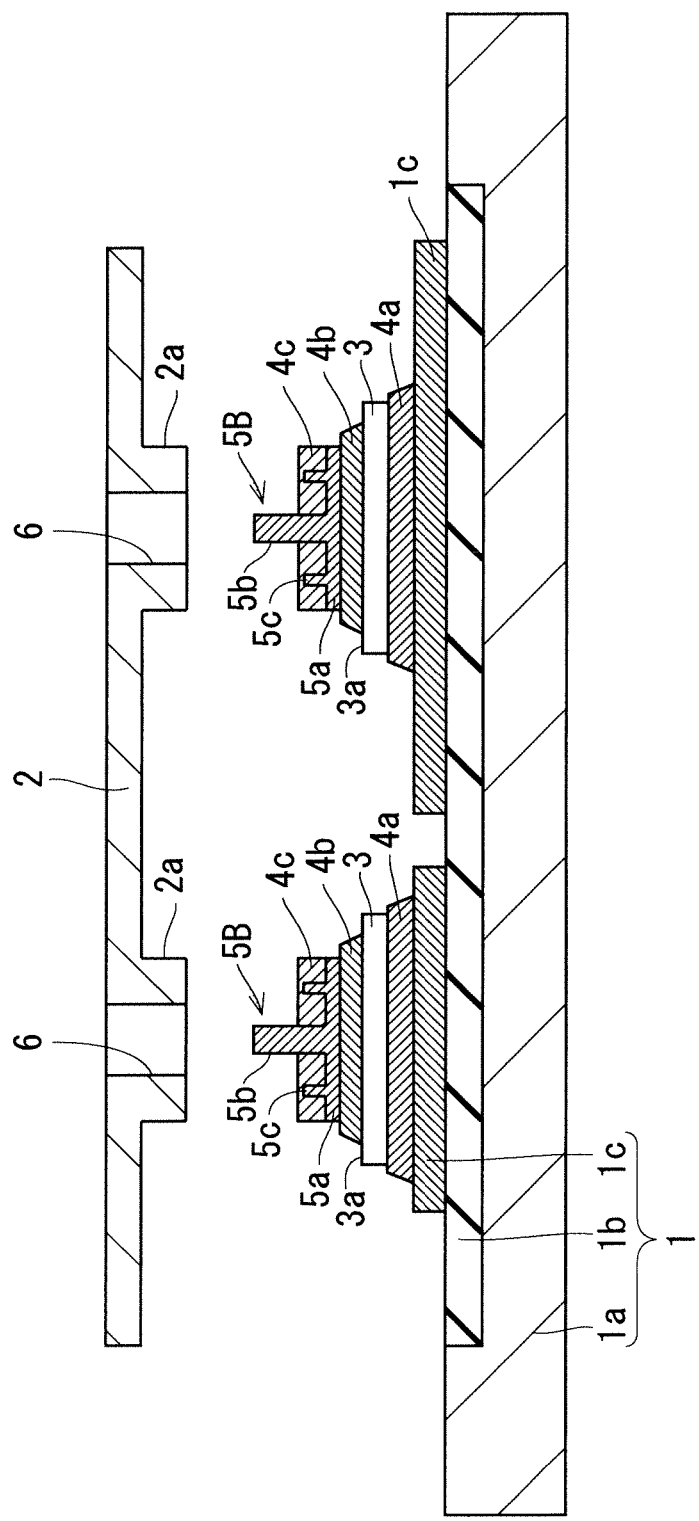
FIG. 7 is a cross-sectional view of a semiconductor device being assembled according to Embodiment 3.
Figure 10:
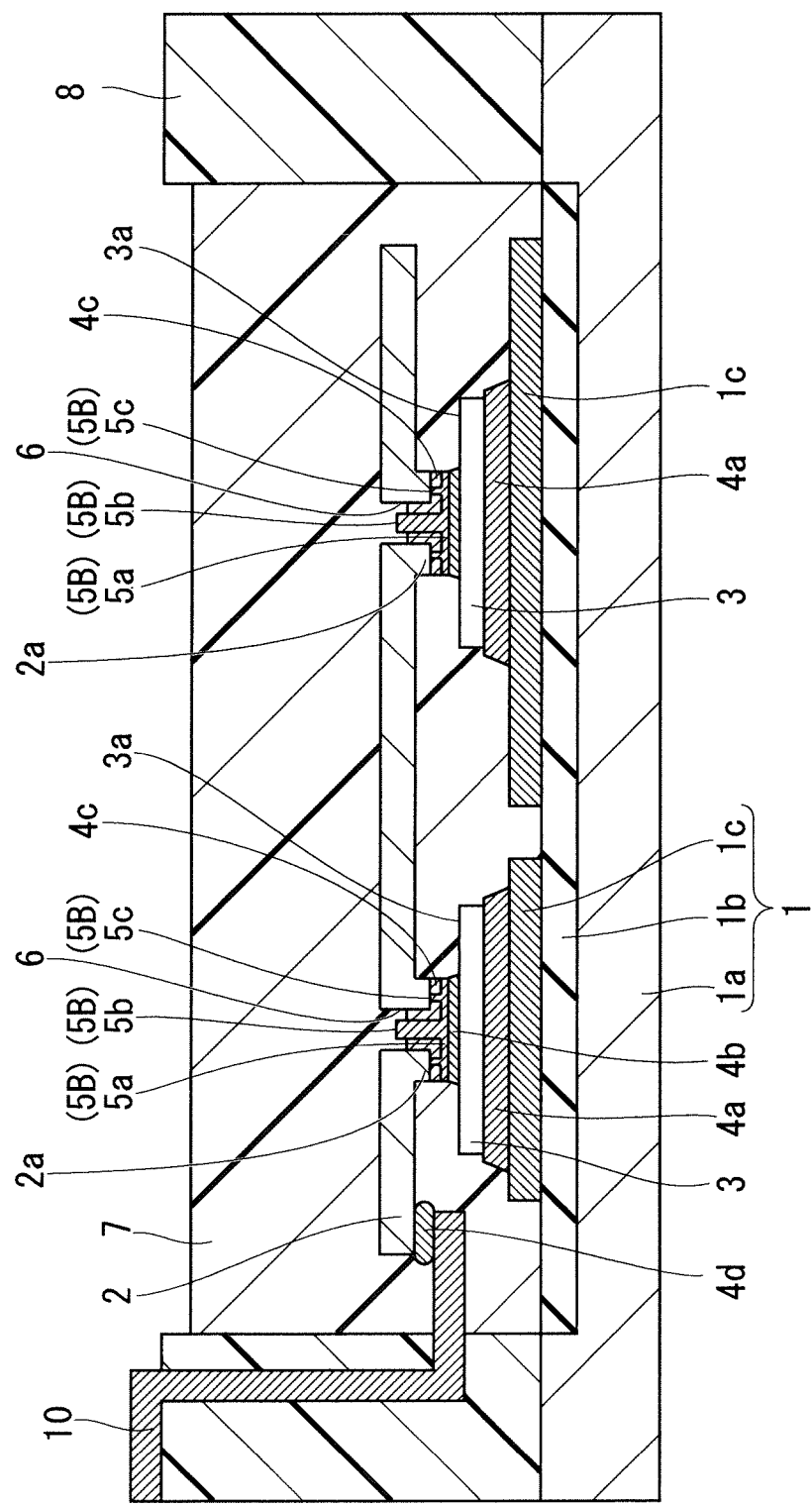
FIG. 10 is a cross-sectional view of the semiconductor device according to Embodiment 3.

Next, a semiconductor device according to Embodiment 3 will be described. FIG. 7 is a cross-sectional view of the semiconductor device being assembled according to Embodiment 3. FIG. 8 is a perspective view of an example metal part 5B included in the semiconductor device according to Embodiment 3. FIG. 9 is a perspective view of another example metal part 5B included in the semiconductor device according to Embodiment 3. FIG. 10 is a cross-sectional view of the semiconductor device according to Embodiment 3. In Embodiment 3, the same reference numerals are assigned to the same constituent elements described in Embodiments 1 and 2, and the description thereof will be omitted.

As illustrated in FIGS. 7, 8, and 10, the semiconductor device according to Embodiment 3 includes the metal parts 5B instead of the metal parts 5A according to Embodiment 2. Unlike the metal part 5A, the metal part 5B includes a plurality of protrusions 5c. Specifically, the metal part 5B includes the circular plate portion 5a, the column portion 5b, and the plurality of protrusions 5c (e.g., three protrusions 5c).

The plurality of protrusions 5c are disposed on the upper surface of the plate portion 5a that is a surface facing the lead electrode 2, and protrude toward the lead electrode 2. The plurality of protrusions 5c are quadrangular prisms lower than the column portion 5b, and abut the thick portion 2a of the lead electrode 2, with the metal part 5B being inserted into the through hole 6. Here, the protrusion 5c corresponds to the first protrusion. Furthermore, the plate portion 5a is not limited to a circular plate, but may be a rectangular plate as illustrated in FIG. 9.

When the semiconductor device is assembled, the bonding material 4c is applied to the plate portions 5a so that the lead electrode 2 is bonded to the metal parts 5B with the bonding material 4c. The application method of the bonding material 4c is identical to that according to Embodiment 2. The other basic structures of the semiconductor device are identical to those according to Embodiment 1.

The number of the protrusions 5c need not be limited to two or more but may be one. The protrusions 5c need not be limited to quadrangular prisms but may be columns.

[Advantages]

Similarly to Embodiment 1, the heat generated in the lead electrode 2 when conducting a large current can be reduced, and the bonding quality between the lead electrode 2 and the semiconductor elements 3 can be inspected easily in the semiconductor device according to Embodiment 3.

The plurality of protrusions 5c are disposed on the upper surface of the plate portion 5a that is a surface facing the lead electrode 2, and protrude toward the lead electrode 2.

Since the protrusions 5c can prevent the bonding material 4c applied to the upper surfaces of the plate portions 5a from spilling, the thickness of the bonding material 4c required for bonding the lead electrode 2 to the metal parts 5B can be secured. This prevents deterioration of the semiconductor device due to change in the temperature, and can prolong the life of the semiconductor device.

Embodiment 4

[Structure of Semiconductor Device]

Figure 11:
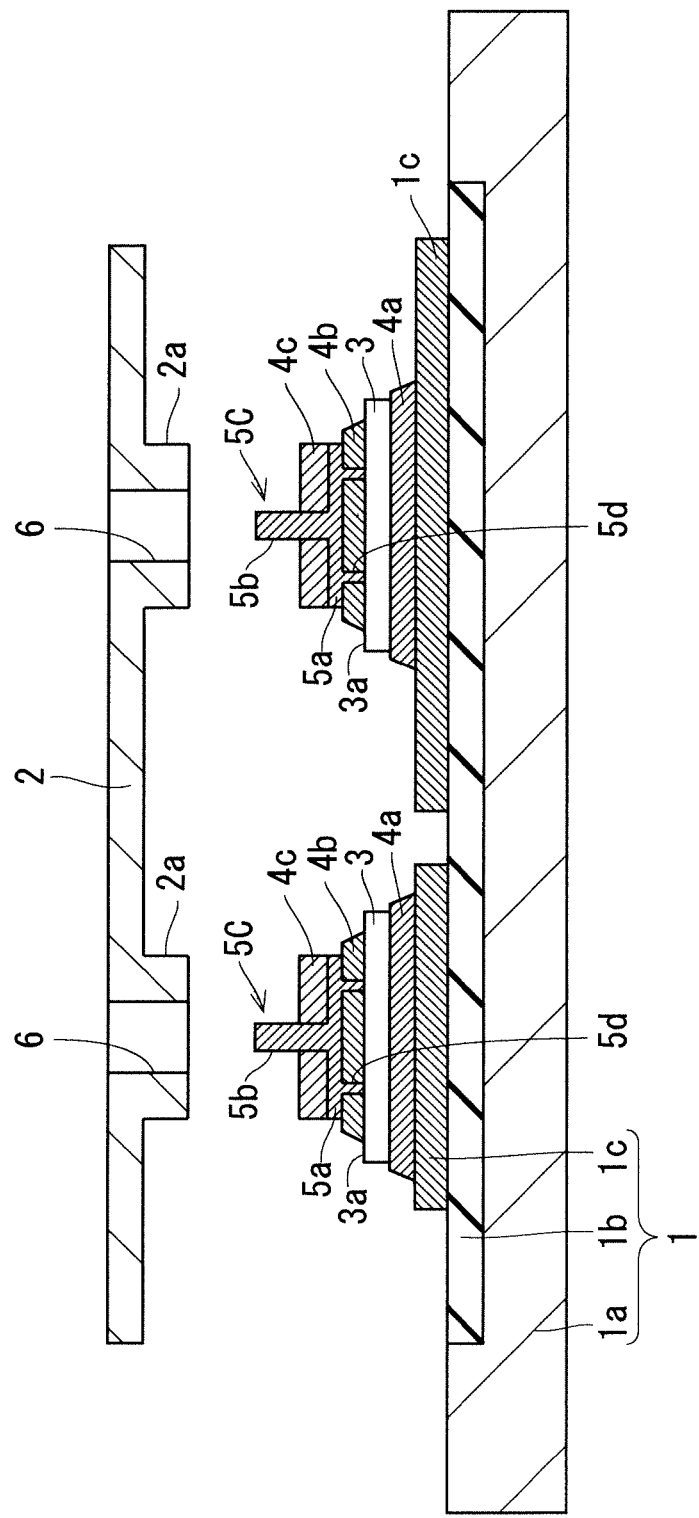
FIG. 11 is a cross-sectional view of a semiconductor device being assembled according to Embodiment 4.
Figure 12:
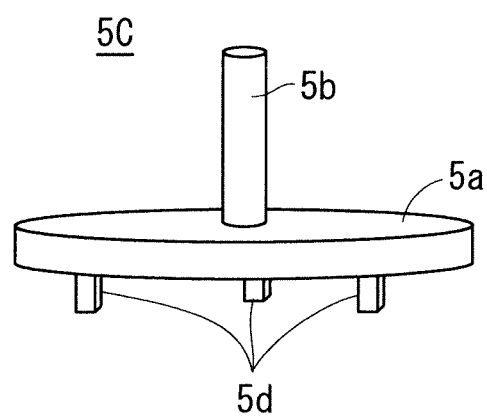
FIG. 12 is a perspective view of an example metal part included in the semiconductor device according to Embodiment 4.
Figure 13:
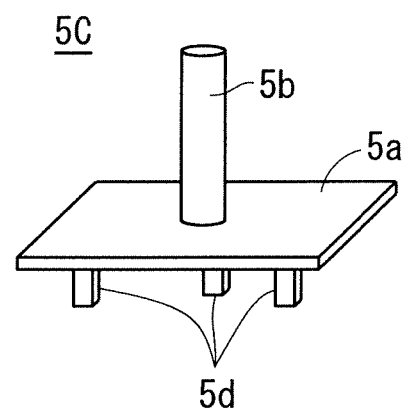
FIG. 13 is a perspective view of another example metal part included in the semiconductor device according to Embodiment 4.
Figure 14:
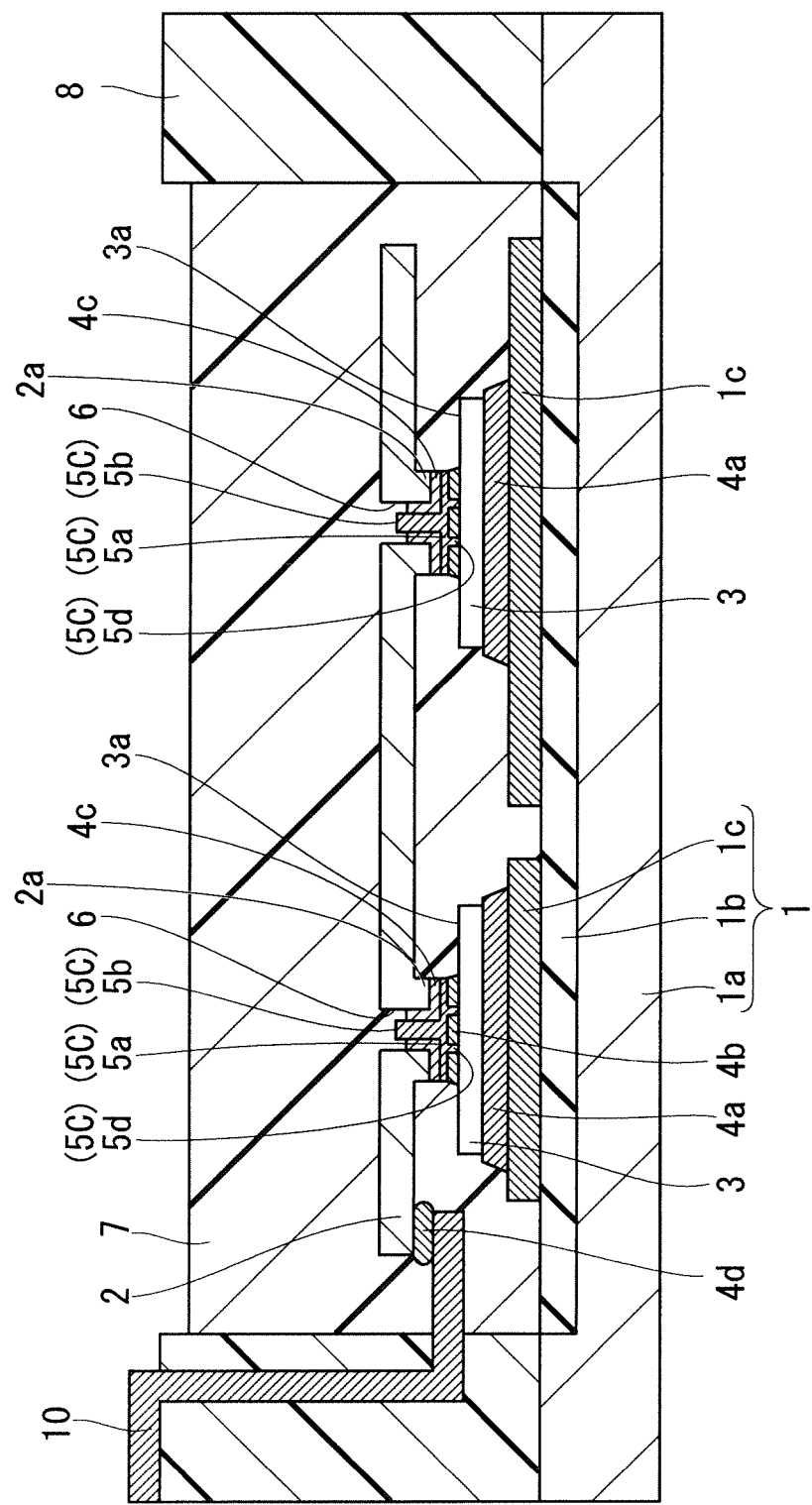
FIG. 14 is a cross-sectional view of the semiconductor device according to Embodiment 4.

Next, a semiconductor device according to Embodiment 4 will be described. FIG. 11 is a cross-sectional view of the semiconductor device being assembled according to Embodiment 4. FIG. 12 is a perspective view of an example metal part 5C included in the semiconductor device according to Embodiment 4. FIG. 13 is a perspective view of another example metal part 5C included in the semiconductor device according to Embodiment 4. FIG. 14 is a cross-sectional view of the semiconductor device according to Embodiment 4. In Embodiment 4, the same reference numerals are assigned to the same constituent elements described in Embodiments 1 to 3, and the description thereof will be omitted.

As illustrated in FIGS. 11, 12, and 14, the semiconductor device according to Embodiment 4 includes the metal parts 5C instead of the metal parts 5A according to Embodiment 2. Unlike the metal part 5A, the metal part 5C includes a plurality of protrusions 5d. Specifically, the metal part 5C includes the circular plate portion 5a, the column portion 5b, and the plurality of protrusions 5d (e.g., three protrusions 5d).

The plurality of protrusions 5d are disposed on the lower surface of the plate portion 5a that is the principal surface of the plate portion 5a bonded to the semiconductor element 3, and protrude toward the semiconductor element 3. The plurality of protrusions 5d are quadrangular prisms lower than the column portion 5b, and abut the principal surface 3a of the semiconductor element 3, with the metal part 5C being disposed on the principal surface 3a of the semiconductor element 3. Here, the protrusion 5d corresponds to the second protrusion. Furthermore, the plate portion 5a is not limited to a circular plate, but may be a rectangular plate as illustrated in FIG. 13.

When the semiconductor device is assembled, the bonding material 4c is applied to the plate portions 5a so that the lead electrode 2 is bonded to the metal parts 5C with the bonding material 4c. The application method of the bonding material 4c is identical to that according to Embodiment 2. The other basic structures of the semiconductor device are identical to those according to Embodiment 1.

The number of the protrusions 5d need not be limited to two or more but may be one. The protrusions 5d need not be limited to quadrangular prisms but may be columns.

[Advantages]

Similarly to Embodiment 1, the heat generated in the lead electrode 2 when conducting a large current can be reduced, and the bonding quality between the lead electrode 2 and the semiconductor elements 3 can be inspected easily in the semiconductor device according to Embodiment 4.

The plurality of protrusions 5d protruding toward the semiconductor element 3 are disposed on the lower surface of the plate portion 5a that is the principal surface of the plate portion 5a bonded to the semiconductor element 3.

Since the protrusions 5d can prevent the bonding material 4b applied to the lower surfaces of the plate portions 5a from spilling, the thickness of the bonding material 4b required for bonding the metal parts 5C to the semiconductor elements 3 can be secured. This prevents deterioration of the semiconductor device due to change in the temperature, and can prolong the life of the semiconductor device.

Embodiment 5

[Structure of Semiconductor Device]

Figure 15:
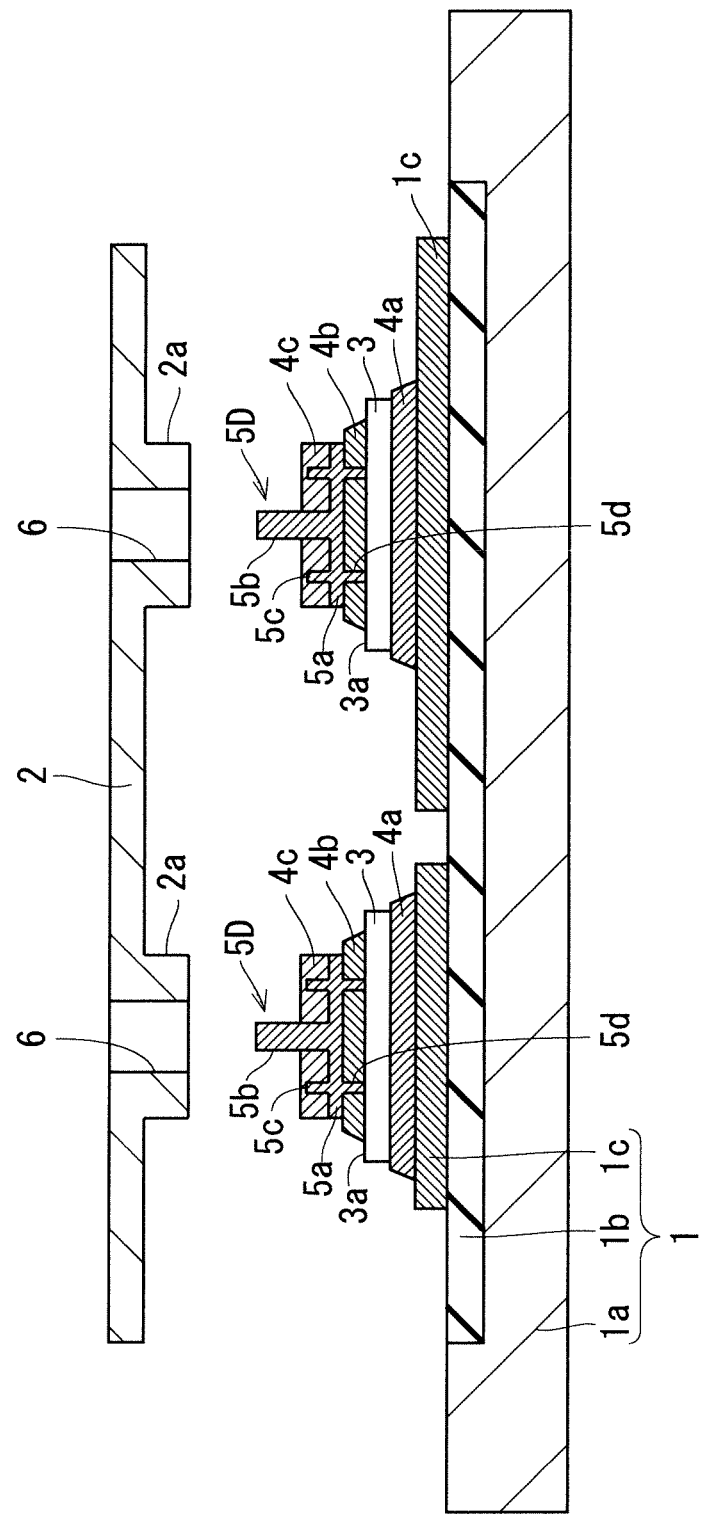
FIG. 15 is a cross-sectional view of a semiconductor device being assembled according to Embodiment 5.
Figure 16:
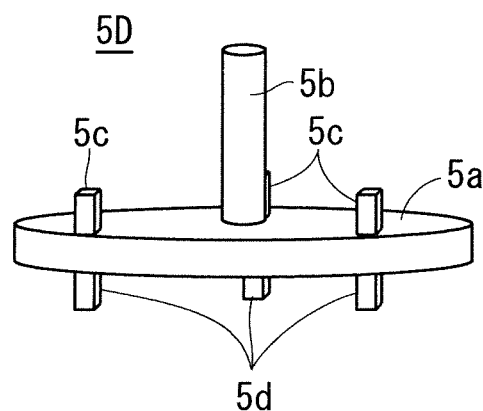
FIG. 16 is a perspective view of an example metal part included in the semiconductor device according to Embodiment 5.
Figure 17:
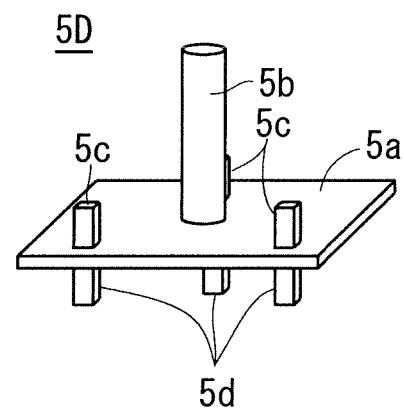
FIG. 17 is a perspective view of another example metal part included in the semiconductor device according to Embodiment 5.
Figure 18:
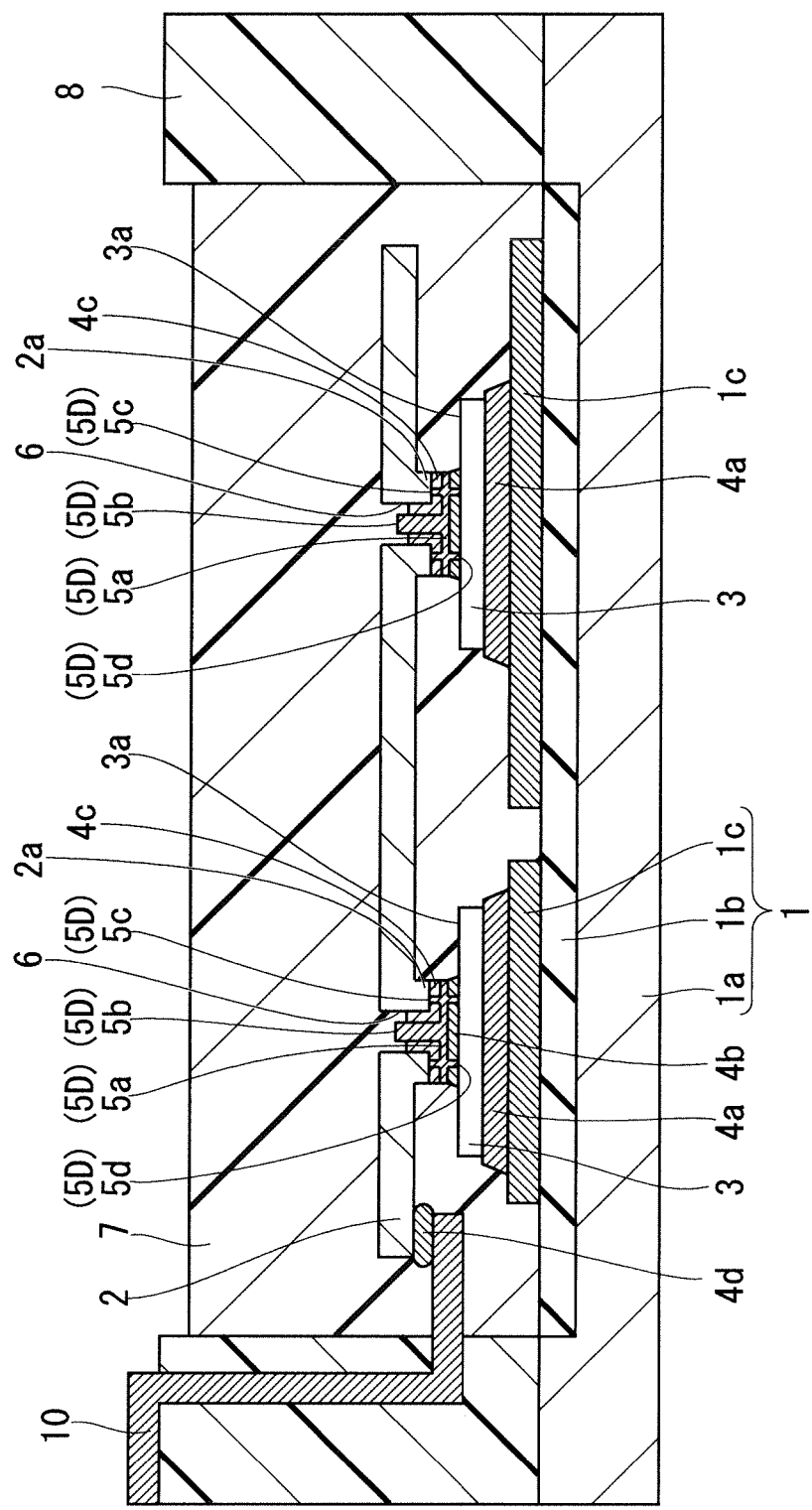
FIG. 18 is a cross-sectional view of the semiconductor device according to Embodiment 5.

Next, a semiconductor device according to Embodiment 5 will be described. FIG. 15 is a cross-sectional view of the semiconductor device being assembled according to Embodiment 5. FIG. 16 is a perspective view of an example metal part 5D included in the semiconductor device according to Embodiment 5. FIG. 17 is a perspective view of another example metal part 5D included in the semiconductor device according to Embodiment 5. FIG. 18 is a cross-sectional view of the semiconductor device according to Embodiment 5. In Embodiment 5, the same reference numerals are assigned to the same constituent elements described in Embodiments 1 to 4, and the description thereof will be omitted.

As illustrated in FIGS. 15, 16, and 18, the semiconductor device according to Embodiment 5 includes the metal parts 5D instead of the metal parts 5A according to Embodiment 2. Unlike the metal part 5A, the metal part 5D includes the plurality of protrusions 5c and the plurality of protrusions 5d. Specifically, the metal part 5D includes the circular plate portion 5a, the column portion 5b, the plurality of protrusions 5c (e.g., three protrusions 5c), and the plurality of protrusions 5d (e.g., three protrusions 5d). Furthermore, the plate portion 5a is not limited to a circular plate, but may be a rectangular plate as illustrated in FIG. 17.

When the semiconductor device is assembled, the bonding material 4c is applied to the plate portions 5a so that the lead electrode 2 is bonded to the metal parts 5D with the bonding material 4c. The application method of the bonding material 4c is identical to that according to Embodiment 2. The other basic structures of the semiconductor device are identical to those according to Embodiment 1.

The number of each of the protrusions 5c and the protrusions 5d need not be limited to two or more but may be one. The protrusions 5c and the protrusions 5d need not be limited to quadrangular prisms but may be columns. The protrusions 5c may be different in length, shape, and number from the protrusions 5d.

[Advantages]

Similarly to Embodiment 1, the heat generated in the lead electrode 2 when conducting a large current can be reduced, and the bonding quality between the lead electrode 2 and the semiconductor elements 3 can be inspected easily in the semiconductor device according to Embodiment 5.

Furthermore, the thickness of the bonding material 4c required for bonding the lead electrode 2 to the metal parts 5D can be secured similarly to Embodiment 3, and the thickness of the bonding material 4b required for bonding the metal parts 5D to the semiconductor elements 3 can be secured similarly to Embodiment 4. This prevents deterioration of the semiconductor device due to change in the temperature, and can prolong the life of the semiconductor device.

Since the protrusions 5c are different in length, shape, and number from the protrusions 5d, the thickness of each of the bonding materials 4b and 4c can be adjusted to a necessary thickness. Thus, the stable bondability of the metal parts 5D to the semiconductor elements 3 and the lead electrode 2 can be obtained.

Embodiments can be freely combined, and appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a base portion;
    a semiconductor element mounted on the base portion;
    a metal part having one end bonded, with a bonding material, to a principal surface of the semiconductor element which is opposite to another principal surface of the semiconductor element mounted on the base portion, the metal part being erect with respect to the semiconductor element; and a lead electrode connected to the semiconductor element through the metal part, wherein the lead electrode includes a through hole extending in a thickness direction, and the metal part connects the semiconductor element to the lead electrode, with the metal part being inserted into the through hole of the lead electrode together with a part of the bonding material.

2. The semiconductor device according to claim 1, wherein the metal part includes: a plate portion having one principal surface bonded to the principal surface of the semiconductor element, and another principal surface bonded to a surrounding area of the through hole in the lead electrode; and a column portion that is erect with respect to the plate portion and is inserted into the through hole, and the one principal surface of the plate portion bonded to the semiconductor element has an area larger than an area of a surface of an end of the column portion to be inserted into the through hole.

3. The semiconductor device according to claim 2, wherein at least one first protrusion protruding toward the lead electrode is disposed on the other principal surface of the plate portion facing the lead electrode.

4. The semiconductor device according to claim 2, wherein at least one second protrusion protruding toward the semiconductor element is disposed on the one principal surface of the plate portion bonded to the semiconductor element.

5. The semiconductor device according to claim 3, wherein at least one second protrusion protruding toward the semiconductor element is disposed on the one principal surface of the plate portion bonded to the semiconductor element.

6. The semiconductor device according to claim 5, wherein the at least one first protrusion is different in length, shape, and number from the at least one second protrusion.

* * * * *